(12) United States Patent
Benjamin et al.

(10) Patent No.: US 10,096,376 B2
(45) Date of Patent: Oct. 9, 2018

(54) QUANTUM TECHNOLOGY

(71) Applicant: Oxford University Innovation Limited, Botley, Oxford (GB)

(72) Inventors: Simon Benjamin, Oxford (GB); John Morton, London (GB)

(73) Assignee: OXFORD UNIVERSITY INNOVATION LIMITED, Oxford (GB)

( * ) Notice: Subject to any disclaimer, the term of this patent is extended or adjusted under 35 U.S.C. 154(b) by 29 days.

(21) Appl. No.: 15/120,578

(22) PCT Filed: Feb. 23, 2015

(86) PCT No.: PCT/GB2015/050510
§ 371 (c)(1),
(2) Date: Aug. 22, 2016

(87) PCT Pub. No.: WO2015/124950
PCT Pub. Date: Aug. 27, 2015

(65) Prior Publication Data
US 2017/0018312 A1    Jan. 19, 2017

(30) Foreign Application Priority Data
Feb. 21, 2014    (GB) .................................. 1403063.9

(51) Int. Cl.
*G11C 23/00*    (2006.01)
*G06N 99/00*    (2010.01)

(52) U.S. Cl.
CPC ........... *G11C 23/00* (2013.01); *G06N 99/002* (2013.01)

(58) Field of Classification Search
CPC ............................. G11C 23/00; G06N 99/002
See application file for complete search history.

(56) References Cited

U.S. PATENT DOCUMENTS

| 5,126,574 A | * | 6/1992 | Gallagher ................. B82B 3/00 |
| | | | 250/423 F |
| 2002/0130313 A1 | | 9/2002 | Zagoskin et al. |
| 2006/0183002 A1 | | 8/2006 | Yang et al. |

FOREIGN PATENT DOCUMENTS

EP    1310910 A1    5/2003

OTHER PUBLICATIONS

Wang, Brrian "1 million qubit quantum computers by 2025" https://www.nextbigfuture.com/2013/12/1-million-qubit-quantum-computers-by.html, Dec. 2012.*

(Continued)

*Primary Examiner* — Matthew Reames
(74) *Attorney, Agent, or Firm* — Withrow & Terranova, P.L.L.C.; Vincent K. Gustafson

(57) ABSTRACT

A device for the storage and/or processing of quantum information comprises: a body (6), formed from a material having negligible net nuclear or electronic magnetic field; a set of data entities (4) embedded in said body, each having a plurality of magnetic field states; a set of probes (2), offset from the body, arranged to acquire internal phase shifts due to the magnetic fields of said data entities; wherein the probes (2) are each arranged to move relative to a plurality of data entities (4) in order that each probe (2) acquires an internal phase shift from the plurality of data entities (4); and means for reading each probe (2), thereby establishing a parity of the plurality of data entities (4).

46 Claims, 3 Drawing Sheets

(56) References Cited

OTHER PUBLICATIONS

Steffen, Matthias. "A prototype Quantum Computer Using Nuclear Mpins in Liquid Solution," Dissertation, Jun. 2003.*
Kane, "Asilicon-based nuclear spin quantum computer," Nature vol. 393, May 1998.*
Notification of Transmittal (Form PCT/ISA/220), International Search Report (Form PCT/ISA/210), and Written Opinion (Form PCT/ISA/237) for International Patent Application No. PCT/GB2015/050510 dated Sep. 10, 2015, 15 pages.
Berman, G.P., et al., "Solid-state quantum computer based on scanning tunneling microscopy," Physical Review Letters, APS USA, vol. 87, No. 9, pp. 097902/1-3, Aug. 27, 2001.
DiVincenzo, David P., et al., "Multi-qubit parity measurement in circuit quantum electrodynamics," New Journal of Physics 15 (2013) 075001, Jul. 2013, IOP Publishing Ltd. and Deutsche Physikalische Gesellschaft.
Search Report for United Kingdom Patent Application No. GB1403063.9 dated Aug. 22, 2014 (4 pages).
O'Gorman, Joe, et al., "A silicon-based surface code quantum computer," arXiv:1406.5149v3 [quant-ph], Sep. 23, 2015, available from the Internet: <URL: https//arxiv.org/pdf/1406.5149v3.pdf>.

* cited by examiner

QUANTUM TECHNOLOGY

This application is a 35 U.S.C. § 371 national phase filing of International Application No. PCT/GB2015/050510 filed on Feb. 23, 2015, and further claims priority to United Kingdom Patent Application No. 1403063.9 filed on Feb. 21, 2014, with the disclosures of the foregoing applications hereby being incorporated by reference herein in their respective entireties.

This application relates to quantum technology, more specifically to quantum information processing in quantum computers.

A quantum computer is a device that processes quantum information, which is a generalisation of 'classical' bits (i.e. 1's and 0's) which existing computers process. A quantum computer has the potential to be far more powerful as certain kinds of processes can be performed much more efficiently. However, so far the only commercial quantum computer is a specialised device produced by the company D-Wave, which is so far limited in scale and applicability. A general purpose quantum computer is yet to be realised.

The introduction of quantum computers is not just aimed at improving current computer technologies, as due to the inherent differences in operation it will provide a different method of operation. In particular, quantum computers will offer the opportunity for a very substantial improvement in certain tasks which exploit large scale parallel processing, through the use of state superpositions.

In a computer formed of quantum bits ('qubits'), each qubit can be placed in one of two states. However, due to the nature of quantum bits, they can also be placed in a superposition of these two states. If every qubit of a computer is placed in a suitable such superposition of states, the overall superposition of states in the computer scales as $2^n$, where n is the number of qubits. By placing a computer in this superposition of states, problems such as code breaking can be solved much more rapidly. This can be viewed as resulting from the fact that, rather than running through each possible combination of qubit states sequentially, the qubits are in every possible combination at once. Procedures called quantum algorithms are used, which allow the operator of the computer to determine the correct answer from just one run, or a small number of runs, of the machine; two examples are Grover's Algorithm for searching data, and Shor's Algorithm for factoring (which relates to code breaking).

Improvements in technology have allowed state superpositions to be created which can last as long as 3 hours before degrading (using phosphorous impurities in pure silicon). However, in order to produce and maintain a superposition of states, each qubit must be isolated from all observers, to prevent the superposition waveform collapsing. Creating an architecture in which components can be placed in this superposition and subsequently processed without collapsing the waveform is key to the advancing of quantum information processing but to date this problem has not been successfully overcome.

A previous proposal for a quantum computer architecture is known as the Kane proposal. This suggests using phosphorous impurities embedded into a pure silicon lattice. The nuclear spins from the phosphorous would then be used as qubits, and manipulated using oscillating magnetic fields such that each qubit can be addressed individually. Under the proposal spins would be transferred from phosphorous nuclei to donor electrons, and the donor electrons from a number of nuclei would be drawn into a common region by applying a potential in order to cause an interaction between neighbouring spins. However, individually addressing each qubit is difficult, and the inventors are not aware of any practical, scalable implementation of the proposal.

When viewed from a first aspect, the invention provides a device for the storage and/or processing of quantum information, comprising:
  a body, formed from a material having negligible net nuclear or electronic magnetic field;
  a set of data entities embedded in said body, each having a plurality of magnetic field states;
  a set of probes, offset from the body, arranged to acquire internal phase shifts due to the magnetic fields of said data entities;
  wherein the probes are each arranged to move relative to a plurality of data entities in order that each probe acquires an internal phase shift from the plurality of data entities; and
  means for reading each probes, thereby establishing a parity of the plurality of data entities.

The invention extends to a method of processing quantum information using a plurality of probes arranged over a plurality of data entities, wherein each data entity has a plurality of magnetic field states, the method comprising
  moving said probes relative to said plurality of data entities such that each probe acquires an internal phase shift from each of a group of said data entities in turn; and
  measuring the total internal phase shift acquired by each probe, in order to measure a parity for said group of data entities.

Thus it can be seen by those skilled in the art that in accordance with the invention probes are used to process information stored in a group of data entities. The inventors have recognised that sufficient information can be gained through a measurement of parity to enable quantum data processing without destroying superpositions of states. This is possible because the internal probe phase is affected by the magnetic field of each data entity, creating an overall phase change which acts as a parity-like check on the data entities. This allows for the data entities to effectively and indirectly to 'interact' as is necessary for meaningful data processing but without enough information being collected to collapse the waveform and destroy the superposition of states. As the parity of groups of entities is then known, this information can be used in stabilizer-based quantum computing methods. Such a recognition has a very great potential significance.

As used herein, the term 'negligible net nuclear or electronic magnetic field' is intended to refer to an arrangement which has no such fields as far as is practicable. It is recognised that in practice all materials will have some small fraction of nuclear-spin bearing isotopes. In accordance with the invention, however, the number of such isotopes will be negligible compared to the bulk material and the net nuclear or electronic magnetic field will be negligible in comparison to the isolated data entities and/or probes.

By physically moving a probe so that it is in the vicinity of each data entity of a group in turn, the phase of the probe is changed due to the magnetic field of a single data entity each time but is not read until it has been influenced by all of the group. The movement of the probe allows the data entities to be embedded sufficiently far away from each other that they do not interact directly. This separation furthermore means that when the probe 'visits' a given data entity it is not significantly affected by the field of the other nearby data entities. This allows each data entity to be accurately represented, increasing the accuracy of the overall parity measurement. It will be appreciated that the introduction of physical movement into a quantum system is highly counter-intuitive, particularly as said movement can be carried out using existing technologies, e.g. akin to those used in conventional magnetic hard-disk read/write mechanisms.

Typically each entity is a qudit, i.e. a quantum entity with d states. In a set of embodiments, the number of states for each qudit may be two, i.e. a qubit, or three, i.e. a qutrit.

The number of data entities in a group which are read by a single probe can be chosen to suite a particular application, but in a set of embodiments, a probe acquires an internal phase shift from a group of four entities. This may require a relatively large number of probes, but allows for the entire set of data entities to be read very rapidly as each probe only needs to read a small number of data entities. Decreasing the number of probes may reduce costs, but it will also increase the time taken to read data from the set of data entities. Each probe may read a single group of entities, but in a set of embodiments a probe reads a plurality of groups of data entities consecutively, wherein each group of data entities is read in a different cycle.

In a set of embodiments, the magnetic fields of the data entities and the probes may be flipped after the parity is established for a plurality of data entities, before the probe re-acquires an internal phase shift from each of the data entities. This may help to overcome the effect of unintentional magnetic effects arising, for example, from unwanted impurities in or on the surface of the body, i.e. between the probe and the data entities. By flipping the magnetic fields of both the data entities and the probes, the overall internal phase shift acquired by the probe due to the data entities is the same, but any impurity effects will differ, allowing them to be quantified and ignored.

The data entities and probes may be formed from any magnetic object, for example superconducting rings, but in a set of embodiments they are formed from spins of electrons or nuclei. These provide magnetic fields which can impact upon the phase of a probe, allowing for parity checks to be carried out.

Preferably the data entities are sufficiently spaced apart that they substantially cannot interact with one another, preventing the collapse of a superposition of states. In a set of embodiments, adjacent data entities are spaced apart by between 100 nm and 1000 nm, e.g. between 400 nm and 600 nm. In order to acquire an internal phase shift from a data entity, the measuring distance between a probe and a data entity must be relatively small. In a set of embodiments, the distance between a probe and a data entity is between 10 nm and 100 nm, e.g. between 40 nm and 60 nm. As the measurement distance is significantly smaller than the spacing distance, the internal phase shift acquired is not significantly affected by data entities that are not being measured at that time.

In a set of embodiments the probes are embedded in a second body. This second body is offset from the first body, and is able to move relative to the first body.

In a set of embodiments, the data entities comprise phosphorous atoms in pure silicon. In a set of embodiments, the probes also comprise phosphorous atoms. In such embodiments the two atoms therefore interact to cause the phase change in the probe.

Once a probe has acquired a total internal phase shift from a group of data entities, the total internal phase shift of the probe can be measured. In a set of embodiments, the probe comprises an optically active entity, i.e. an entity whose state can be read using a pulse of light. In a set of embodiments, charge-coupled device (CCD) detectors are used to capture the optical state of each of the probes. In a set of embodiments, the probe comprises a nitrogen-vacancy centre in a diamond nano-crystal, as this provides an optically active entity (i.e. an optically active spin).

In an alternative set of embodiments, the probes may not be optically active, and instead the phase shift may be measured using metal gating above the probes.

In a set of embodiments, the data entities and probes are formed from the same material. The body of the device may be formed from any material in which there are negligible free magnetic fields. In a set of embodiments, the body comprises pure silicon. Pure silicon, for example pure silicon-28, has no free spins, as all electrons are paired and the nuclei have no spin. A material with no free magnetic fields is desired as this ensures that the data entities which do have such fields can be isolated, as long as they are placed sufficiently far apart.

The data entities may be formed from any embedded entities that have a net magnetic field, for example arsenic, antimony or bismuth atoms. However, in a set of embodiments, the data entities are phosphorus atoms. These provide a series of isolated spins (i.e. magnetic fields) within the body.

In order to measure parity, a basis must be chosen for the measurement, e.g. an axis to measure against. One basis may be chosen, but in a set of embodiments, two bases are used alternately for the parity measurement. In a set of embodiments, the two bases are the X-basis and the Z-basis.

In a set of embodiments, a probe is used to perform a parity measurement on a plurality of groups of data entities. These groups may be adjacent to one another, but in a set of embodiments they are complementary groups.

The movement may be carried out in any suitable manner, but in a set of embodiments micromechanical systems (MEMS) are used to move the plurality of probes.

In a set of embodiments, the layer of data entities and layer of probes may be arranged adjacent to one another before the data entities and probes are embedded into the layers.

In a set of embodiments, the second body comprises a number of recesses between probes.

Although, as set out above, significant advantages may be achieved by having a set of probes physically moving relative to a set of data entities, the inventors recognise that there may be circumstances where the probes could also be embedded in the body and so not move relative to the data entities. Thus according to another invention disclosed herein there is provided a device for the storage and/or processing of quantum information, comprising:

a body formed from a material having negligible net nuclear or electronic magnetic field;
  a set of data entities having a plurality of magnetic field states embedded in said body;
  a set of probes also embedded in said body and arranged such that each probe is arranged to acquire an internal phase shift due to the magnetic field of a plurality of said data entities;
  means for applying a set of manipulations to the data entities and probes which reduce undesired interactions between the data entities and probes; and
  means for reading each probe, thereby establishing a parity of the plurality of data entities.

As used herein, undesired interactions between data entities and probes may be, for example, interactions between a probe and data entities which are not adjacent to the probe. Reducing these interactions may minimise the effect of more distant data entities, allowing the probe to measure its adjacent (and therefore desired) data entities more accurately. Alternatively, undesired interactions may be those between two probes, or between two data entities, as they are ideally isolated from one another.

The spacing between a data entity and a probe may take any value, but in a set of embodiments it is between 10 and 500 nm, e.g. between 20 and 100 nm. The spacing between adjacent data entities may take any value, but in a set of embodiments it is between 10 nm and 1000 nm, e.g. between 50 and 200 nm, due to the proximity needed between a data entity and a probe for the probe to be able to acquire an internal phase shift.

Due to the close proximity between data entities, the data entities may be able to interact with one another. However, in a set of embodiments decoupling pulses are applied to data entities in order to reduce the net effect of data entity interactions.

Decoupling pulses are used to flip the magnetic field of certain data entities relative to one another, in order to minimise interactions between data entities.

A number of embodiments of the present invention will now be described, by way of example only, with reference to the accompanying drawings in which.

Figure 1:
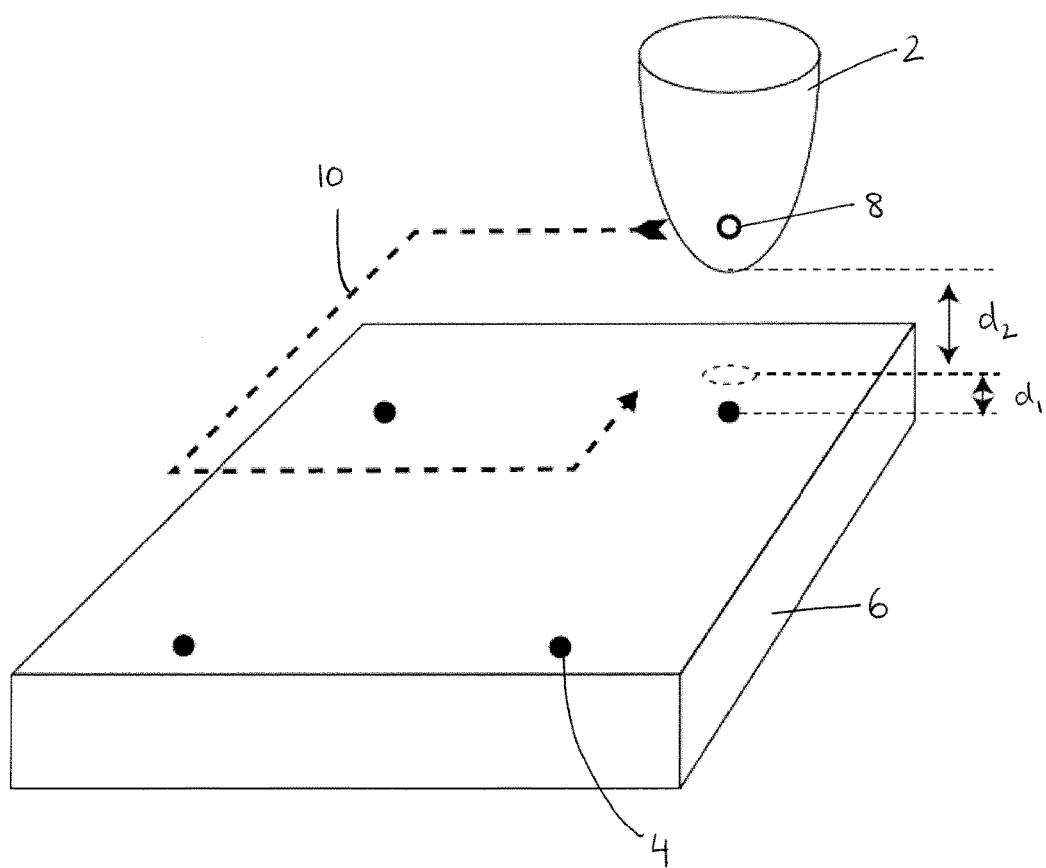
FIG. 1 shows an embodiment of the invention in which a probe is used to visit a number of data entities.

FIG. 1 shows an embodiment of the invention in which quantum information can be stored and/or processed by a probe 2 acquiring a phase shift from a plurality of data entities 4 in order to establish the parity of said entities. The plurality of data entities 4 are embedded within a body 6, at a depth $d_1$ below the surface of the body 6. The probe 2 is held at a distance $d_2$ above the surface of the body 6. In this embodiment, the body 6 is formed from pure silicon and the data entities are phosphorous impurities. The probe 2 contains an entity 8, which is able to interact with the data entities 4. The entity 8 may be an optically active entity, for example an NV centre in diamond.

In use, the probe 2 begins at a position above one of the data entities 4 separated from it by a distance $d_1+d_2$. The probe then follows a cyclic path 10 around a plurality of data entities 4, such that it is in the vicinity of each of the data entities 4 in turn. In this embodiment, each probe 2 accesses four data entities 4, but any number of data entities 4 could be used.

When the probe 2 is in the vicinity of each data entity 4, it acquires an internal phase shift from that data entity 4. This phase shift is dependent on the magnetic field of the data entity 4, which in this embodiment is due to the spin of the data entity. The time for which a probe 2 is in the vicinity of a data entity 4 will control the extent of the internal phase shift in the probe 2, meaning that if a probe 2 moves too quickly between the data entities 4, the distinction between different spins will be smaller, potentially reducing the accuracy of a parity measurement. The distance $d_1+d_2$ is also a factor in determining the extent of the internal phase shift caused in the probe 2.

Once the probe 2 has completed the path 10, the overall internal phase shift can be measured. As the probe contains an optically active entity 8, the total phase shift can be measured optically. This gives a parity of the group of data entities 4, which effects a form of processing of the data stored in the states of the individual entities.

In an ideal situation, when the probe 2 is in the vicinity of a data entity 4, it is not affected by any other data entities 4. It therefore acquires an internal phase shift purely from the data entity 4. For example, if a data entity 4 has an 'up' spin, the probe 2 may acquire a phase shift of +90°, whereas a 'down' spin may cause a phase shift of −90° over a given period of time. A group of four spins would therefore give an overall phase shift of −360°, 0°, 360°, −180° or 180°. These five options are split into two groups, those which return the phase indicator on a notional Bloch sphere to it's original point, and those that result in a 180° phase shift from that position. The two options are therefore very distinct, and provide the two possible parities. If the probe 2 were to spend a shorter amount of time in the vicinity of a data entity 4, it may not fully acquire a 90° phase shift from said data entity 4, causing the overall internal phase shift to be less clear. Furthermore, a different number of data entities may give rise to different possible parities.

In order to overcome the effect of unintentional magnetic fields arising, for example, from unwanted impurities on the surface between the probe and data entities, a two-stage sequence of phase acquisition may be employed. In the first stage, the probe 2 acquires a phase shift of +45° if the data entity 4 has an 'up' spin, whereas a 'down' spin would cause a phase shift of −45°. Then both the probe and data entities are flipped, so that their mutual interaction is unchanged, but their interaction with unintentional magnetic fields is reversed in sign. In the second stage, the probe 2 acquires a further + or −45° phase shift, depending on the data entity. The net result is as above (a group of four data entities 2 would therefore give an overall phase shift of −360°, 0°, 360°, −180° or 180° to the probe 2), but the probe is now more robust to device imperfections.

Figure 2:
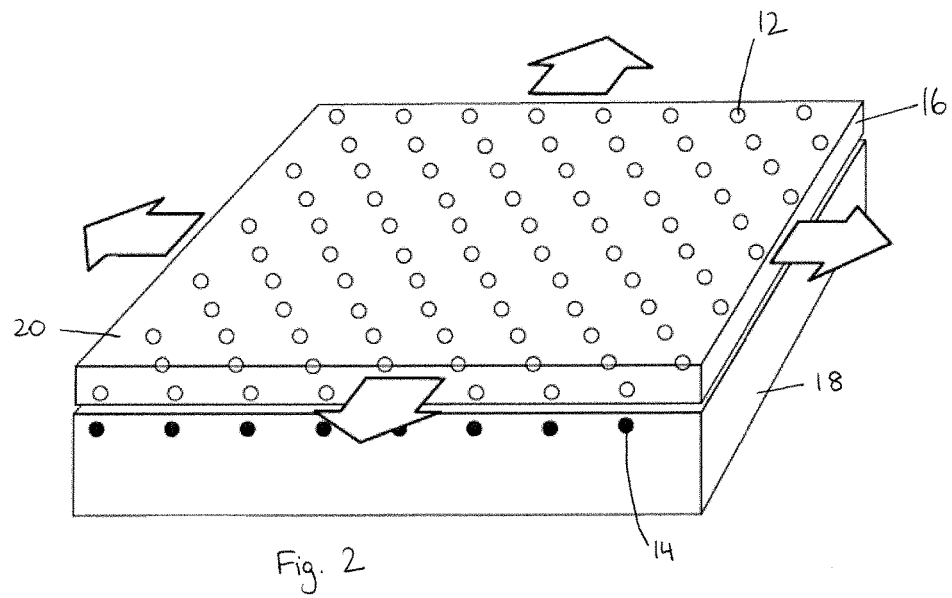
FIG. 2 shows an alternative embodiment using a plurality of probes.
Figure 3:
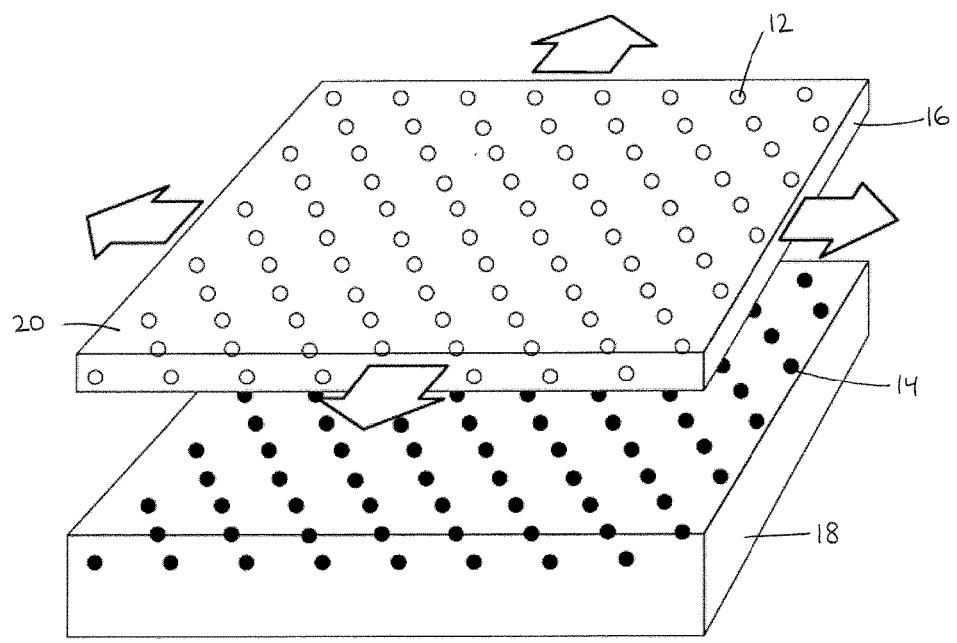
FIG. 3 shows an exploded view of the embodiment of FIG. 2.

FIGS. 2 and 3 show an alternative embodiment of the invention, in which both the probes 12 and the data entities 14 are provided by the same components. The probes 12 are embedded in a separate body 16 from the body 18 containing the data entities. In this embodiment, the probes 12 and data entities 14 may, for example, be formed from phosphorous impurities embedded in pure silicon bodies 16, 18. The probe body 16 is offset from the data entity body 18, and is able to move relative to the data entity body 18. While the probes and 12 data entities 14 are provided by the same components in this embodiment, this is not necessary. The probes 12 may for example be NV centres in diamond, as seen in FIG. 1, while the data entities 14 may be phosphorous impurities embedded in pure silicon bodies.

In use, each of the probes 12 take a path (similar to path 10 seen in FIG. 1) around a plurality of data entities 14 to acquire an internal phase shift from the plurality of data entities 14. The path taken will change depending on the number of data entities being accessed, with the probe body 16 being able to move in four directions above the data entity body 18. The probes 12 and data entities 14 are arranged in regular patterns. If not all of the data entities 14 are arranged in a regular pattern, a parity measurement may be carried out only on a section which is regularly arranged. The overall phase change caused to an individual probe can be measured using metal gating above the probe entities, on the upper surface 20 of the probe body 16. This can switch on and off certain interactions, allowing the parity measurement to be carried out on different groups of data entities 14, depending on the processing being carried out at that time.

Figure 4:
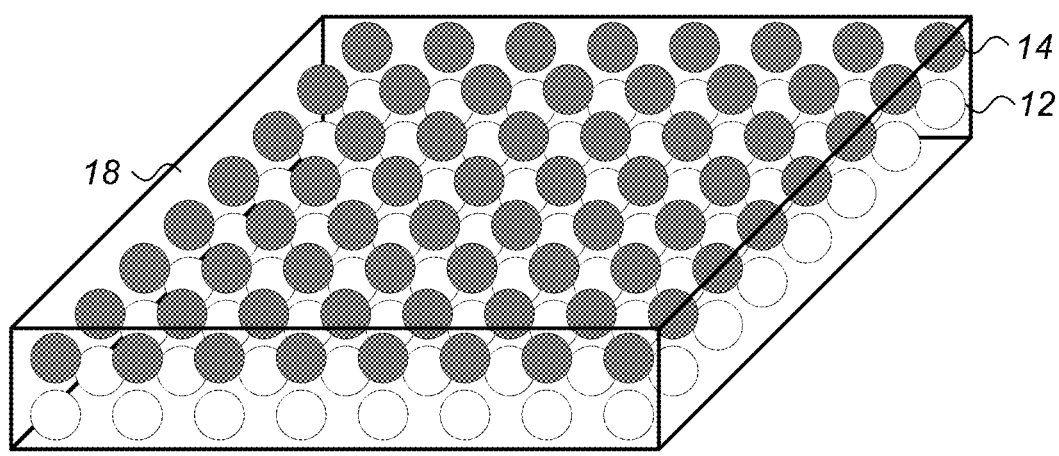
FIG. 4 shows an embodiment of the invention in which a set of data entities and a set of probes are embedded in a body.

FIG. 4 shows an embodiment of the invention in which a set of data entities 14 and a set of probes 12 are embedded in a body 18. In such an embodiment, a device for storage and/or processing of quantum information includes the body 18, the set of data entities 14, and the set of probes 12. The body 18 is formed from a material having negligible net nuclear or electronic magnetic field. The set of data entities 14 has a plurality of magnetic field states. The set of probes 12 are arranged such that each probe of the set of probes 12 is arranged to acquire an internal phase shift due to the magnetic field of a plurality of data entities of the set of data entities 14.

The invention claimed is:

1. A device for storage and/or processing of quantum information, the device comprising:
 a first body, formed from a material having negligible net nuclear or electronic magnetic field;
 a set of data entities embedded in said first body, each data entity of the set of data entities having a plurality of magnetic field states;
 a set of probes, offset from the first body, arranged to acquire internal phase shifts due to magnetic fields of said set of data entities;
 wherein each probe of the set of probes is arranged to move relative to a plurality of data entities of the set of data entities to permit each probe to acquire an internal phase shift from the plurality of data entities; and
 a processor arranged to read each probe, establishing a parity of the plurality of data entities while maintaining any superposition of states with that parity.

2. The device as claimed in claim 1, wherein the set of data entities comprises qudits.

3. The device as claimed in claim 1, comprising two magnetic field states for each data entity.

4. The device as claimed in claim 1, arranged such that a probe acquires an internal phase shift from four data entities.

5. The device as claimed in claim 1, arranged to flip the magnetic fields of the set of data entities and the set of probes after the parity is established for the plurality of data entities, before the probe re-acquires an internal phase shift from each data entity of the set of data entities in order to establish the parity of the plurality of data entities.

6. The device as claimed in claim 1, wherein the set of data entities comprises electrons or nuclei having net spins.

7. The device as claimed in claim 1, comprising a spacing between adjacent data entities of between 100 nm and 1000 nm.

8. The device as claimed in claim 1, comprising a measuring distance between a probe and a data entity of between 10 nm and 100 nm.

9. The device as claimed in claim 1, comprising a second body in which the set of probes is embedded.

10. The device as claimed in claim 9, wherein said second body is offset from the first body, and movable relative to the first body.

11. The device as claimed in a claim 1, wherein the set of data entities and the set of probes are formed from a same material.

12. The device as claimed in claim 11, wherein said set of data entities comprises phosphorous atoms.

13. The device as claimed in claim 1, wherein the set of probes comprises optically active entities.

14. The device as claimed in claim 13, comprising charge-coupled device detectors arranged to capture an optical state of the set of probes.

15. The device as claimed in claim 13, wherein the set of probes comprises nitrogen-vacancy centres in a diamond nano-crystal.

16. The device as claimed in claim 1, wherein the first body comprises silicon.

17. The device as claimed in claim 1, arranged to use two bases alternately for measurement of the parity.

18. The device as claimed in claim 17, arranged to use an X-basis and a Z-basis.

19. The device as claimed in claim 1, wherein a probe performs a parity measurement on a number of complementary pluralities of data entities.

20. The device as claimed in claim 1, comprising micromechanical systems to move the set of probes.

21. The device as claimed in claim 9, wherein the second body comprises a number of recesses between probes of the set of probes.

22. A method of processing quantum information using a plurality of probes arranged over a plurality of data entities, wherein each data entity of the plurality of data entities has a plurality of magnetic field states, the method comprising:
 moving the plurality probes relative to said plurality of data entities such that each probe of the plurality of probes acquires an internal phase shift from each data entity of a group of data entities of said plurality of data entities in turn; and
 measuring a total internal phase shift acquired by each probe, in order to measure a parity for said group of data entities while maintaining any superposition of states with that parity.

23. The method as claimed in claim 22, wherein the plurality of data entities comprises qudits.

24. The method as claimed in claim 22, wherein each data entity has two magnetic field states.

25. The method as claimed in claim 22, comprising acquiring an internal phase shift from four data entities.

26. The method as claimed in claim 22, comprising flipping magnetic fields of the plurality of data entities and the plurality of probes after establishing the parity for the group of data entities, before re-acquiring in each probe an internal phase shift from each data entity of the group of data entities of the plurality of data entities in order to establish a parity of the plurality of data entities.

27. The method as claimed in claim 22, wherein the plurality of data entities comprises electrons or nuclei having net spins.

28. The method as claimed in claim 22, wherein adjacent data entities are spaced apart by between 100 nm and 1000 nm.

29. The method as claimed in claim 22, wherein a measuring distance between a probe and a data entity is between 10 nm and 100 nm.

30. The method as claimed in claim 22, wherein the plurality of data entities is embedded in a first body, and the plurality of probes is embedded in a second body.

31. The method as claimed in claim 30, wherein said second body is offset from the first body, and moves relative to the first body.

32. The method as claimed in claim 22, wherein the plurality of data entities and the plurality of probes are formed from a same material.

33. The method as claimed in claim 32, wherein said plurality of data entities comprises phosphorous atoms.

34. The method as claimed in claim 22, wherein the plurality of probes comprises optically active entities.

35. The method as claimed in claim 34, comprising using charge-coupled device detectors to capture an optical state of the plurality of probes.

36. The method as claimed in claim 34, wherein the plurality of probes comprises nitrogen-vacancy centres in a diamond nano-crystal.

37. The method as claimed in claim 22, comprising using metal gating above the plurality of probes to measure the internal phase shift.

38. The method as claimed in claim 30, wherein the first body comprises silicon.

39. The method as claimed in claim 22, comprising using two bases alternately for measurement of the parity.

40. The method as claimed in claim 39, comprising using an X-basis and a Z-basis.

41. The method as claimed in claim 22, comprising performing a parity measurement on a number of complementary pluralities of data entities.

42. The method as claimed in claim 22, comprising moving the plurality of probes using micromechanical systems.

43. The method as claimed in claim 30, wherein the second body comprises a number of recesses between probes of the plurality of probes.

44. A device for storage and/or processing of quantum information, the device comprising:

a body formed from a material having negligible net nuclear or electronic magnetic field;

a set of data entities having a plurality of magnetic field states embedded in said body;

a set of probes also embedded in said body and arranged such that each probe of the set of probes is arranged to acquire an internal phase shift due to a magnetic field of a plurality of data entities of said set of data entities;

an entity and probe manipulator arranged to apply a set of manipulations to the set of data entities and the set of probes which reduce undesired interactions between the set of data entities and the set of probes; and a processor arranged to read each probe of the set of probes, establishing a parity of the plurality of data entities of said set of data entities while maintaining any superposition of states with that parity.

45. The device as claimed in claim 44, comprising a spacing between a data entity and a probe of between 10 and 500 nm.

46. The device as claimed in claim 44, comprising a spacing between adjacent data entities of between 10 and 1000 nm.

* * * * *